US006724253B2

United States Patent
Hau et al.

(10) Patent No.: US 6,724,253 B2
(45) Date of Patent: Apr. 20, 2004

(54) PREDISTORTION TYPE LINEARIZER CONTROLLED BY TWO CONTROL VOLTAGES

(75) Inventors: Gary Hau, Tokyo (JP); Naotaka Iwata, Tokyo (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 10/162,297

(22) Filed: Jun. 4, 2002

(65) Prior Publication Data

US 2002/0186082 A1 Dec. 12, 2002

(30) Foreign Application Priority Data

Jun. 6, 2001 (JP) ........................................ 2001-171817

(51) Int. Cl.[7] .............................. H03F 1/30; H03F 3/16; H03F 3/04
(52) U.S. Cl. ...................... 330/149; 330/144; 330/145; 330/277; 330/302
(58) Field of Search .................. 330/144, 145, 330/149, 277, 302

(56) References Cited

U.S. PATENT DOCUMENTS

| | | | | |
|---|---|---|---|---|
| 3,996,524 A | * | 12/1976 | Sechi | ........................... 330/277 |
| 5,138,275 A | * | 8/1992 | Abbiati et al. | ............... 330/149 |
| 6,307,436 B1 | | 10/2001 | Hau | ............................ 330/149 |
| 6,353,360 B1 | * | 3/2002 | Hau et al. | .................... 330/149 |
| 6,570,430 B1 | * | 5/2003 | Zhou | ........................... 327/317 |

FOREIGN PATENT DOCUMENTS

JP 2000-357926 12/2000 ............. H03F/1/32

OTHER PUBLICATIONS

WO 02/15391 A1 of Sun et al., "Programmable Radio Frequency Predistortion Linearizer and Method Thereof".*

* cited by examiner

Primary Examiner—Patricia Nguyen
(74) Attorney, Agent, or Firm—Hayes Soloway P.C.

(57) ABSTRACT

In a predistortion type linearizer including a FET, an input matching circuit connected to the drain of the FET for receiving an input signal, an output matching circuit connected to the source of said the FET for outputting an output signal, and a inductor having a first terminal connected to the gate of the FET and a second terminal for receiving a first control voltage, a variable impedance circuit is connected to the second terminal of the inductor, and the impedance of the variable impedance circuit is adjusted by a second control voltage.

18 Claims, 11 Drawing Sheets

PREDISTORTION TYPE LINEARIZER CONTROLLED BY TWO CONTROL VOLTAGES

BACKGROUND OF THE INVENTION

1. Field of the Invention

The present invention relates to a predistortion type linearizer for compensating for the nonlinear gain and phase deviation characteristics of a nonlinear amplifier.

2. Description of the Related Art

Recently, digital cellular communication systems have been developed that demand linear power amplifiers. In order to satisfy the high linear characteristic requirement, a linear power amplifier is constructed by a nonlinear amplifier and a predistortion type linearizer for compensating for the gain and phase deviation characteristics of the nonlinear amplifier. That is, the gain and phase deviation characteristics of the predistortion type linearizer are opposite to those of the nonlinear amplifier.

In a prior art predistortion type linearizer including a field effect transistor (FET), an input matching circuit connected to the drain of the FET for receiving an input signal, an output matching circuit connected to the source of the FET for outputting an output signal, and an inductor having a first terminal connected to the gate of the FET and a second terminal for receiving a first control voltage, a constant impedance circuit is connected to the second terminal of the inductor. Thus, independent control of the gain and phase deviation characteristics of the predistortion type linearizer are achieved by changing the value of the inductor and the value of the control voltage (see JP-A-2000-357926). This will be explained later in detail.

In the above-described prior art predistortion type linearizer, however, after the inductor is fixed to the predistortion type linearizer, it is impossible to independently change the gain and phase deviation characteristics by the control voltage.

SUMMARY OF THE INVENTION

It is an object of the present invention to provide a predistortion type linearizer capable of easily adjusting the gain and phase deviation characteristics independently.

According to the present invention, in a predistortion type linearizer including a FET, an input matching circuit connected to the drain of the FET for receiving an input signal, an output matching circuit connected to the source of the FET for outputting an output signal, and an inductor having a first terminal connected to the gate of the FET and a second terminal for receiving a first control voltage, a variable impedance circuit is connected to the second terminal of the inductor, and the impedance of the variable impedance circuit is adjusted by a second control voltage. Thus, the gain and phase deviation characteristics can be adjusted by the first and second control voltages without adjusting the value of the inductor.

BRIEF DESCRIPTION OF THE DRAWINGS

The present invention will be clearly understood from the description set forth below, as compared with the prior art, with reference to the accompanying drawings, wherein.

DESCRIPTION OF THE PREFERRED EMBODIMENTS

Before the description of the preferred embodiments, a prior art predistortion type linearizer will be explained with reference to FIGS. 1, 2, 3A and 3B.

Figure 1:
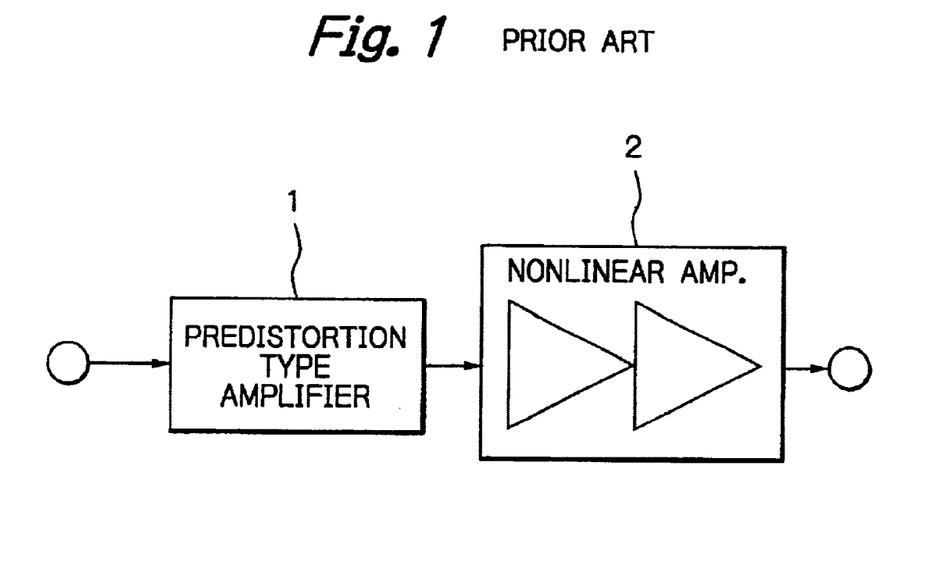
FIG. 1 is a block circuit diagram illustrating a linear power amplifier.

In FIG. 1, which illustrates a prior art linear power amplifier, a predistortion type linearizer 1 is connected in cascade to a nonlinear amplifier 2, in order to compensate for the nonlinear effect of the nonlinear amplifier 2. That is, the gain and phase characteristics of the predistortion type linearizer 1 are opposite to those of the nonlinear amplifier 2.

Figure 2:
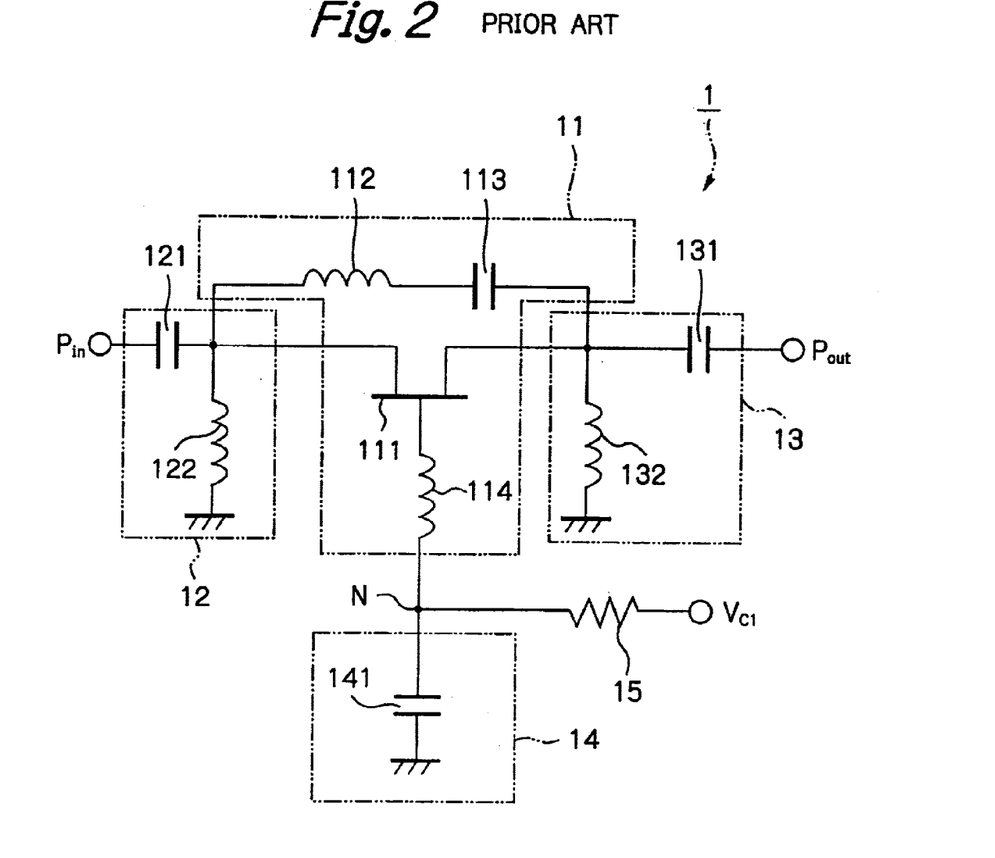
FIG. 2 is a circuit diagram of the predistortion type linearizer of FIG. 1.

In FIG. 2, which is a circuit diagram of the predistortion type linearizer 1 of FIG. 1 (see JP-A-2000-357926), the predistortion type linearizer 1 is constructed by a variable impedance circuit 11, an input matching circuit 12 connected to an input of the variable impedance circuit 11, an output matching circuit 13 connected to an output of the variable impedance circuit 11, and a constant impedance circuit 14 connected to the variable impedance circuit 11, Also, the voltage at a node N between the variable impedance circuit 12 and the constant impedance circuit 14 is controlled via a bias feed resistor 15 by a control voltage $V_{c1}$. Thus, the impedance of the variable impedance circuit 11, i.e., the gain characteristics of the variable impedance circuit 11 is controlled by the control voltage $V_{c1}$.

The variable impedance circuit 11 is constructed by an FET 111, an inductor 112 and a capacitor 113 forming an LC resonant circuit to decrease the insertion loss of the FET 111, and an inductor 114. The inductor 114 resonates with the intrinsic drain-to-source capacitance of the FET 111.

The FET 111 is biased by the control voltage $V_{c1}$ to operate the FET 111 near a pinch-off region. As a result, as the input power $P_{in}$ is increased, the gain of the FET 111 is increased while the phase deviation of the FET 111 is decreased.

The input matching circuit 12 is constructed by a capacitor 121 and a shunt inductor 122 to match the drain of the FET 111 to about 50 Ω. In this case, the capacitor 121 blocks the DC component of the input power $P_{in}$. Also, the shunt inductor 122 is operated to make the phase deviation of the FET 111 negative.

The output matching circuit 13 is constructed by a capacitor 131 and a shunt inductor 132 to match the source of the FET 111 to about 50 Ω. In this case, the capacitor 131 blocks the DC component in the output power $P_{out}$. Also, the shunt inductor 132 is operated to make the phase deviation of the FET 111 negative.

Note that if the shunt inductors 122 and 132 are absent, the phase deviation of the FET 111 is never negative. The values of the shunt inductors 122 and 132 are about 5 nH to 10 nH to achieve negative phase deviation of the FET 111.

The constant impedance circuit 14 is constructed by a capacitor 141 which blocks the DC component of a current flowing between the node N and ground.

Figure 3A:
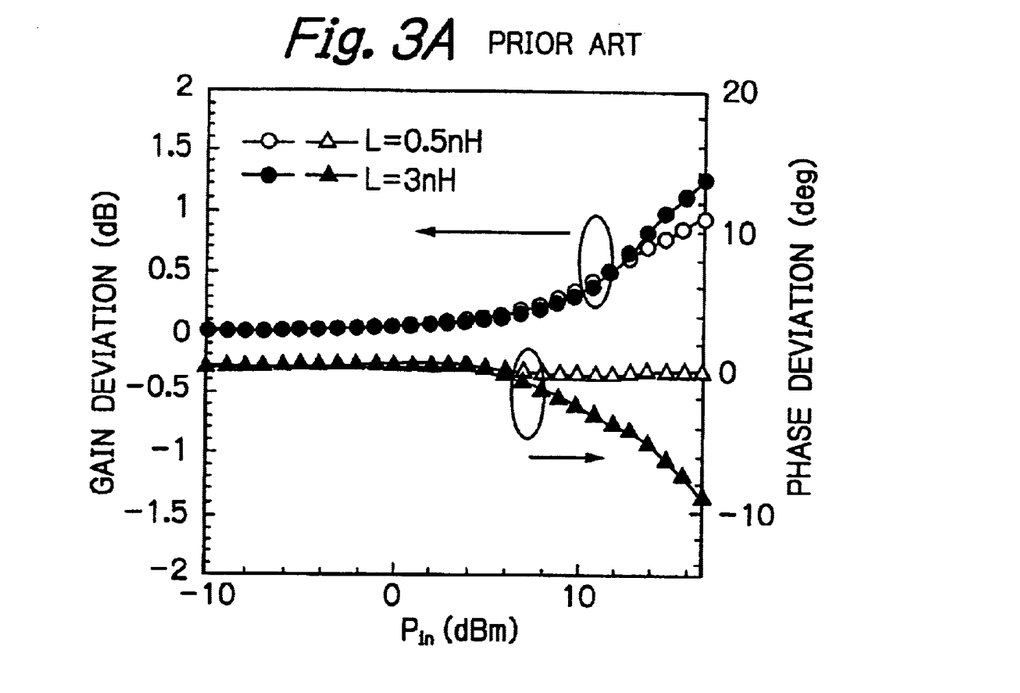
FIGS. 3A and 3B are diagrams showing the gain and phase deviation characteristics of the predistortion type linearizer of FIG. 2.
Figure 3B:
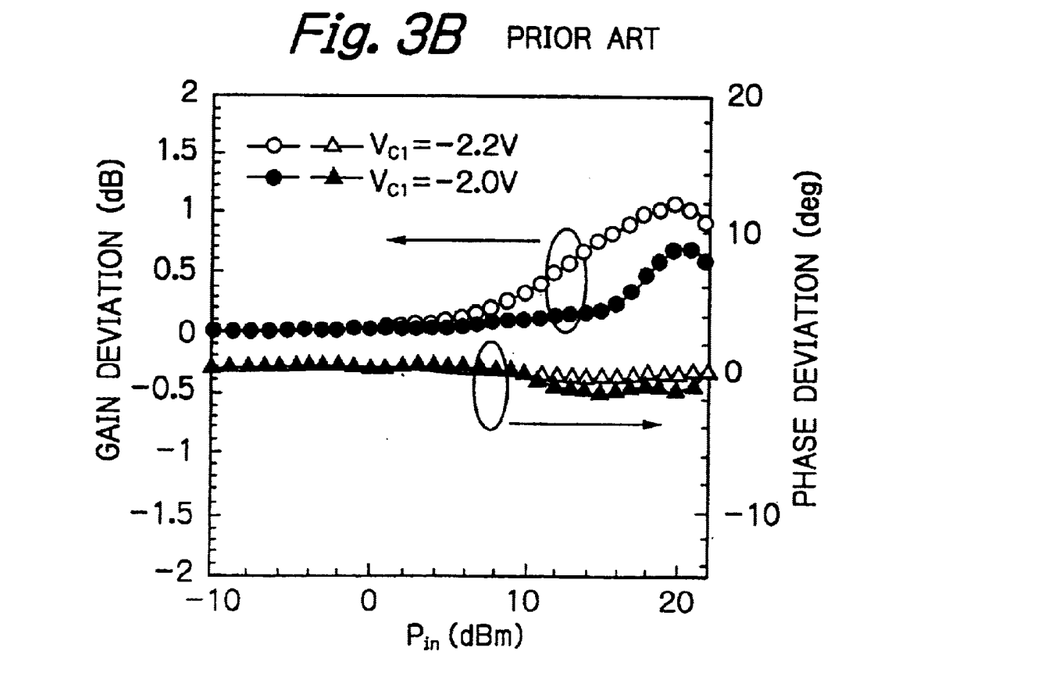

The gain and phase characteristics of the predistortion type linearizer 1 of FIG. 2 at 1.95 GHz are shown in FIGS. 3A and 3B. In FIG. 3A, when the value L of the inductor 114 is changed with the same level of the control voltage $V_{c1}$, the gain and phase deviation characteristics are both changed depending upon the value L of the inductor 114. On the other hand, in FIG. 3B, when the value of the control voltage $V_{c1}$ is changed with the same level of the value L of the inductor 114, the gain deviation characteristics are changed depending the value of the control voltage $V_{c1}$, while the phase deviation characteristics have a negligible effect.

Thus, independent control of the gain and phase deviation characteristics of the predistortion type linearizer 1 of FIG. 2 are achieved by changing the value L of the inductor 114 and the value of the control voltage $V_{c1}$.

In the predistortion type linearizer of FIG. 2, however, after the inductor 114 is fixed to the predistortion type linearizer, it is impossible to independently change the gain and phase deviation characteristics by the control voltage $V_{c1}$.

Figure 4:
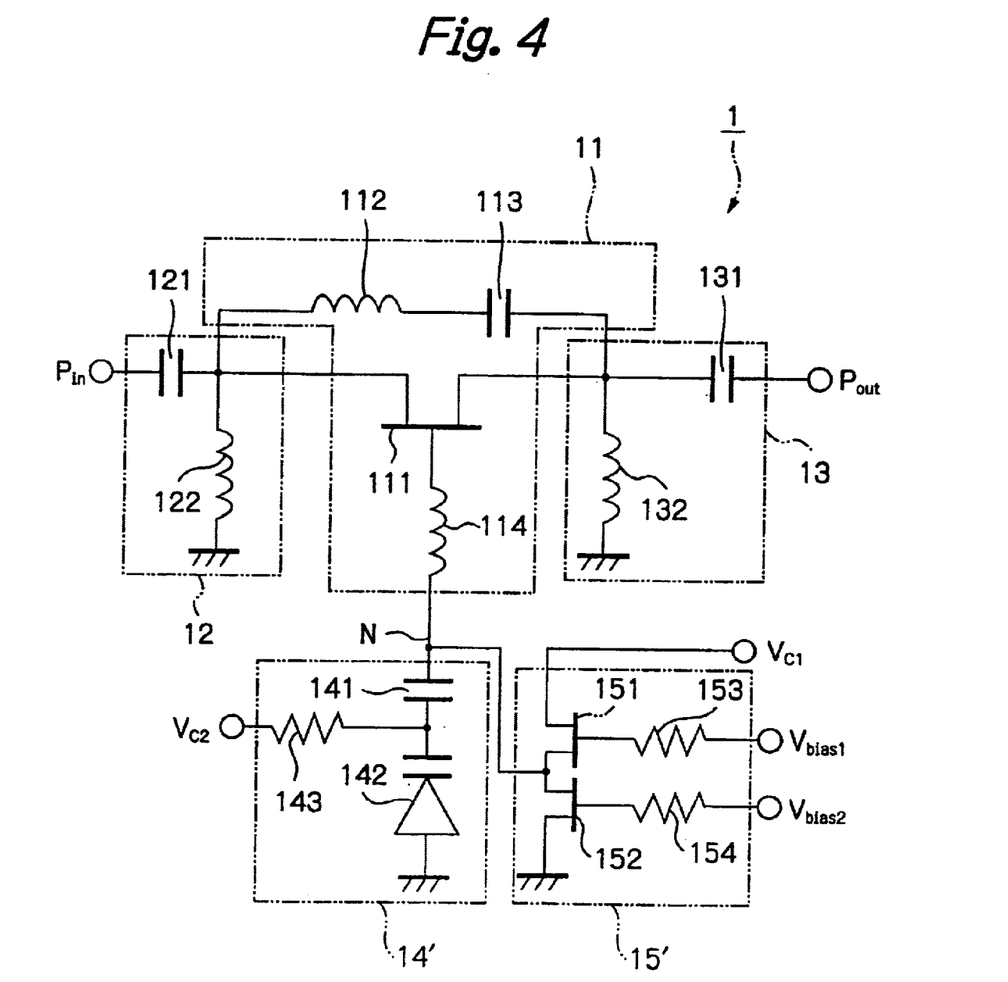
FIG. 4 is a circuit diagram illustrating a first embodiment of the predistortion type linearizer according to the present invention.

In FIG. 4, which illustrates a first embodiment of the predistortion type linearizer according to the present invention, a variable impedance circuit 14' is provided instead of the constant impedance circuit 14 of FIG. 2, and a bias circuit 15' is provided instead of the bias feed resistor 15 of FIG. 2.

The variable impedance circuit 14' is constructed by a varactor diode 142 and a resistor 143 in addition to the capacitor 141. The voltage at the varactor diode 142 is controlled by a control voltage $V_{c2}$, so that the varactor diode 142 serves as a variable capacitor.

The bias circuit 15' is constructed by two FETs 151 and 152 connected in series between the node N and a terminal to which the control voltage $V_{c1}$ is applied. The bias circuit 15' is operated to decrease the operating range of the control voltage $V_{c1}$.

Figure 5A:
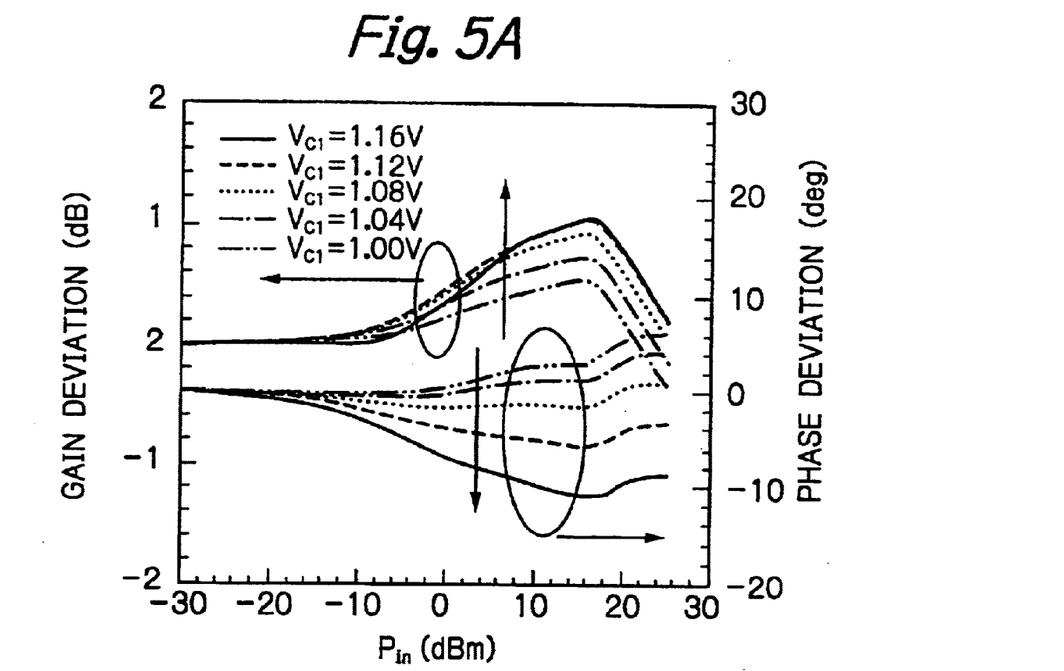
FIGS. 5A and 5B are diagrams showing the gain and phase deviation characteristics of the predistortion type linearizer of FIG. 4.
Figure 5B:
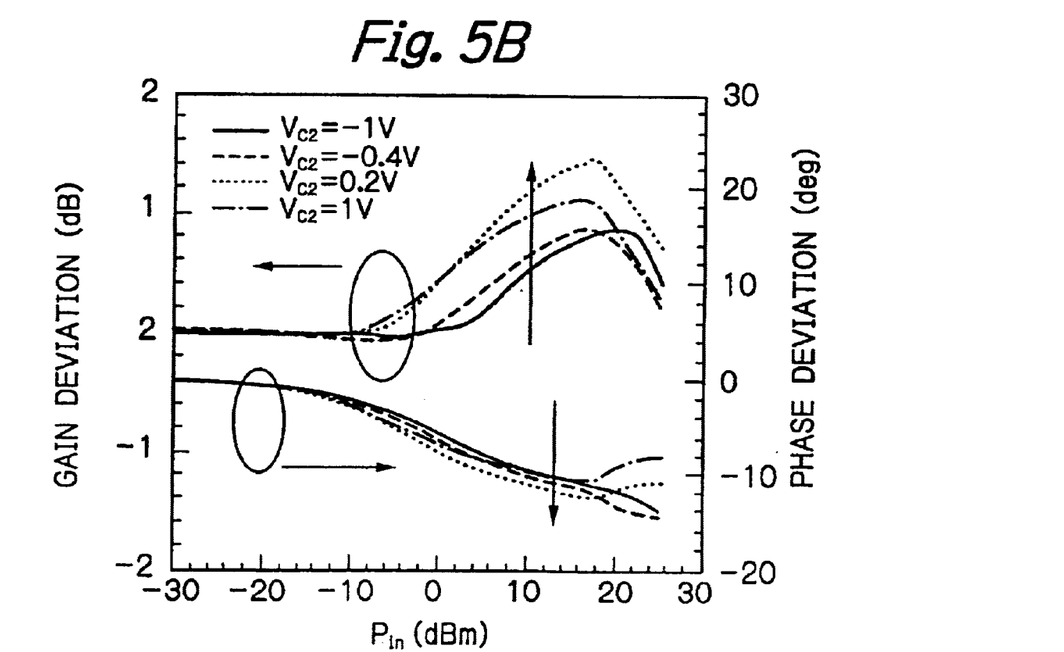

The gain and phase characteristics of the predistortion type linearizer 1 of FIG. 4 at 1.95 GHz are shown in FIGS. 5A and 5B. In FIG. 5A, when the control voltage $V_{c1}$ is changed with the same level of the control voltage $V_{c2}$, the gain and phase deviation characteristics are both changed depending upon the control voltage $V_{c1}$. In this case, when the control voltage $V_{c1}$ is increased, the gain deviation is increased while the phase deviation is decreased. On the other hand, in FIG. 5B, when the value of the control voltage $V_{c2}$ is changed with the same level of the control voltage $V_{c1}$, the gain deviation characteristics are changed depending the value of the control voltage $V_{c2}$, while the phase deviation characteristics have a negligible effect.

Thus, independent control of the gain and phase deviation characteristics of the predistortion type linearizer 1 of FIG. 4 are achieved by changing the value of the control voltage $V_{c1}$ and the value of the control voltage $V_{c2}$. In more detail, first, the control voltage $V_{c1}$ is adjusted to change both the gain and phase deviation characteristics of the predistortion type linearizer 1, thus compensating for the phase deviation characteristics of the nonlinear amplifier 2 of FIG. 1. Then, the control voltage $V_{c2}$ is adjusted to change the gain deviation characteristics of the predistortion type linearizer 1 without affecting the gain deviation characteristics of the predistortion type linearizer 1.

Figure 6A:
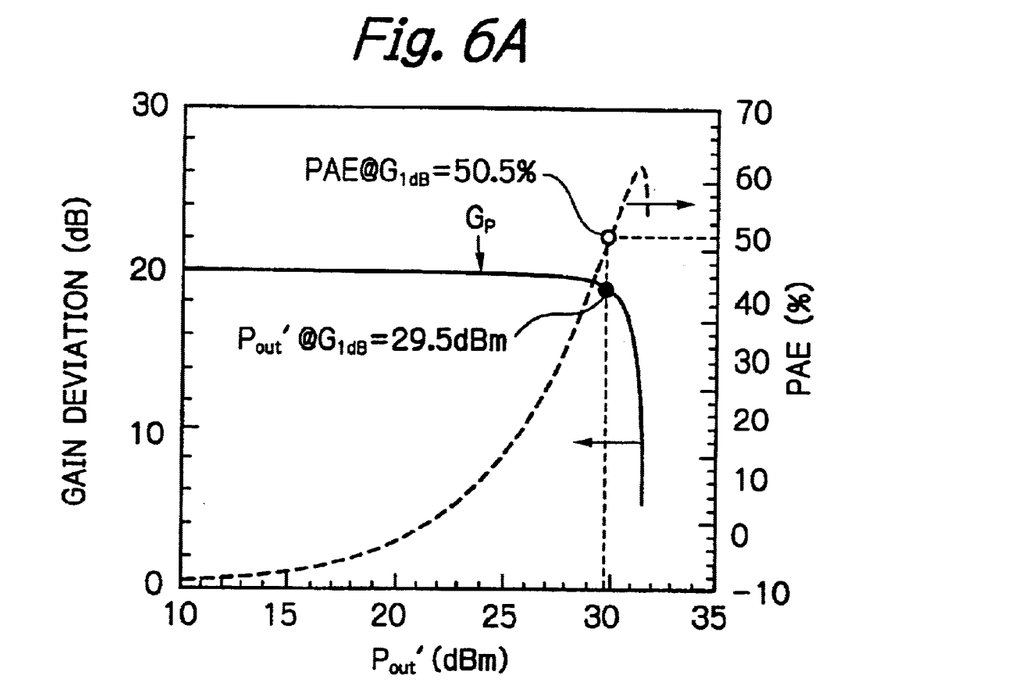
FIG. 6A is a diagram showing the gain deviation characteristics and the power added efficiency of the power amplifier of FIG. 1 without the predistortion type linearizer of FIG. 1.

In FIG. 6A, which is a diagram showing the gain deviation characteristics and the power added efficiency (PAE) of the power amplifier 2 of FIG. 1 without the predistortion type linearizer 1 of FIG. 1, when the output power $P_{out}'$ of the power amplifier 2 is increased, the gain of the power amplifier 2 is decreased. In this case, the output power $P_{out}'$ is 29.5 dBm at gain $G_{1dB}$ by 1 dB smaller than a peak gain $G_P$. On the other hand, when the output power $P_{out}'$ is increased, the PAE is increased. In this case, the PAE is 50.5% at gain $G_{1dB}$.

Figure 6B:
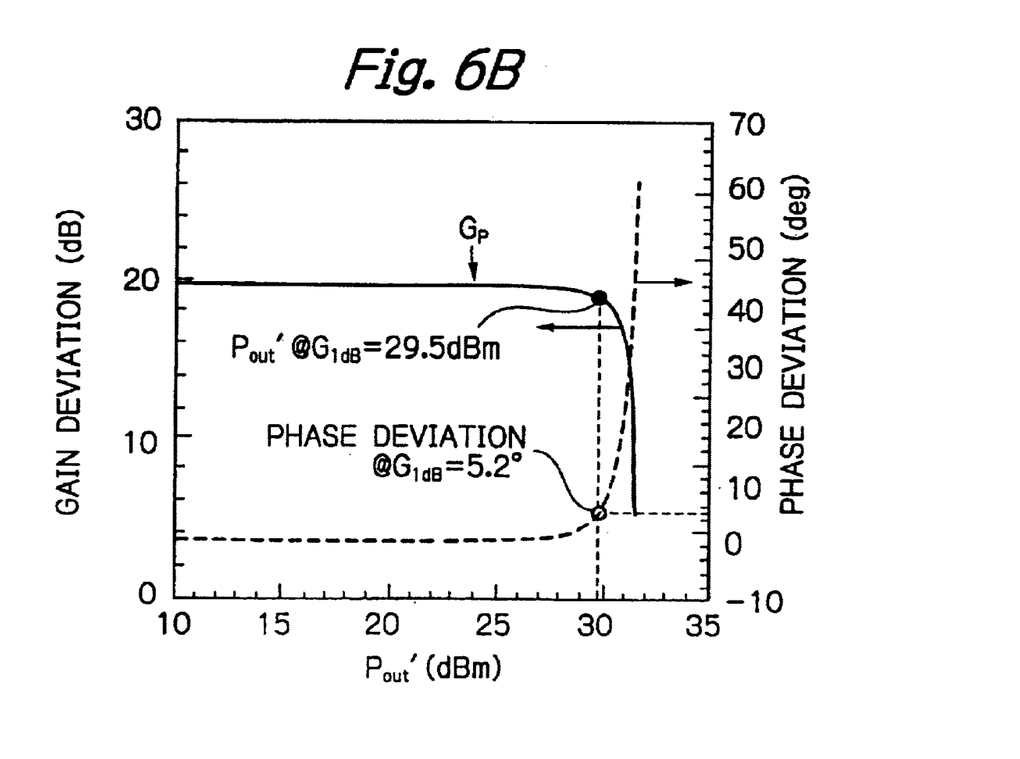
FIG. 6B is a diagram the gain and phase deviation characteristics of the power amplifier of FIG. 1 without the predistortion type linearizer of FIG. 1.

In FIG. 6B, which is a diagram showing the gain and phase deviation characteristics of the power amplifier 2 of FIG. 1 without the predistortion type linearizer 1 of FIG. 1, when the output power $P_{out}'$ is increased, the phase deviation is increased. In this case, the phase deviation is 5.2° at $G_{1dB}$.

Figure 7A:
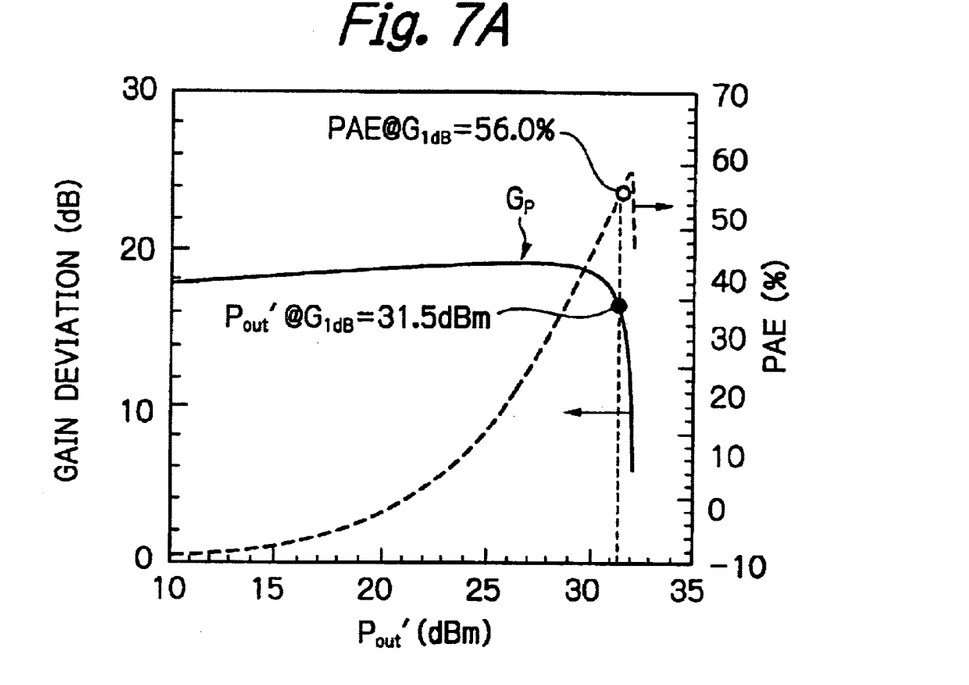
FIG. 7A is a diagram showing the gain deviation characteristics and the power added efficiency of the power amplifier of FIG. 1 with the predistortion type linearizer of FIG. 4.

In FIG. 7A, which is a diagram showing the gain deviation characteristics and the power added efficiency (PAE) of the power amplifier 2 of FIG. 1 with the predistortion type linearizer 1 of FIG. 4, when the output power $P_{out}'$ of the power amplifier 2 is increased, the gain of the power amplifier 2 is decreased. In this case, the output power $P_{out}'$ is 31.5 dBm at gain $G_{1dB}$, which is increased by 2.0 dBm as compared with the case of FIG. 6A. On the other hand, when the output power $P_{out}'$ is increased, the PAE is increased. In this case, the PAE is 56.0% at gain $G_{1dB}$, which is increased by 5.5% as compared with the case of FIG. 6A.

Figure 7B:
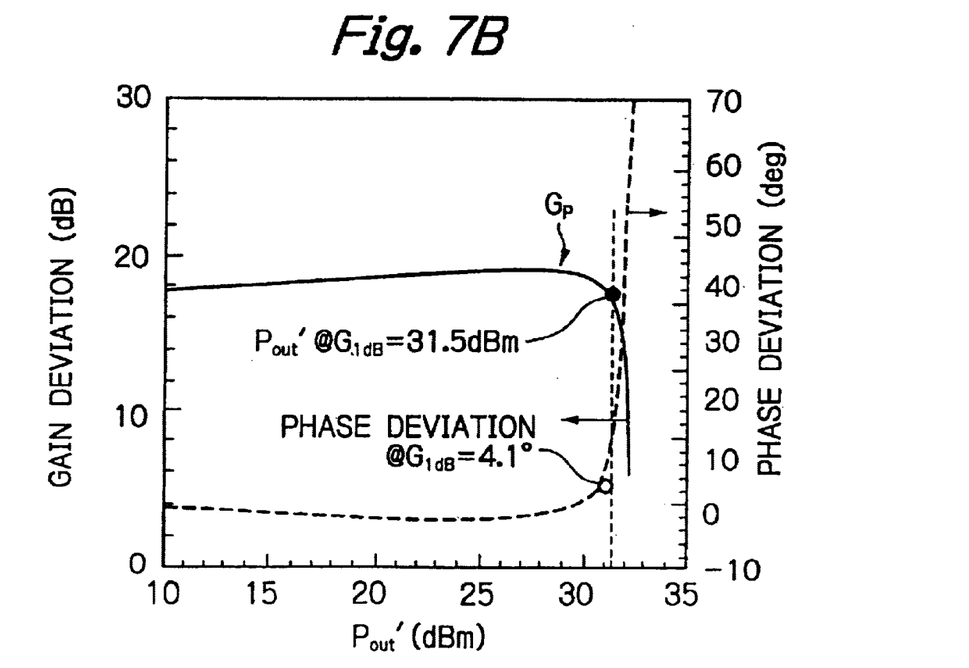
FIG. 7B is a diagram the gain and phase deviation characteristics of the power amplifier of FIG. 1 with the predistortion type linearizer of FIG. 4.

In FIG. 7B, which is a diagram showing the gain and phase deviation characteristics of the power amplifier 2 of FIG. 1 with the predistortion type linearizer 1 of FIG. 4, when the output power $P_{out}'$ is increased, the phase deviation is increased. In this case, the phase deviation is 4.1° at $G_{1dB}$, which is decreased by 1.1°. This shows that the negative phase deviation characteristics of the predistortion type linearizer 1 of FIG. 4 is effective in compensating for the positive phase deviation characteristics of the nonlinear amplifier 2.

Figure 8:
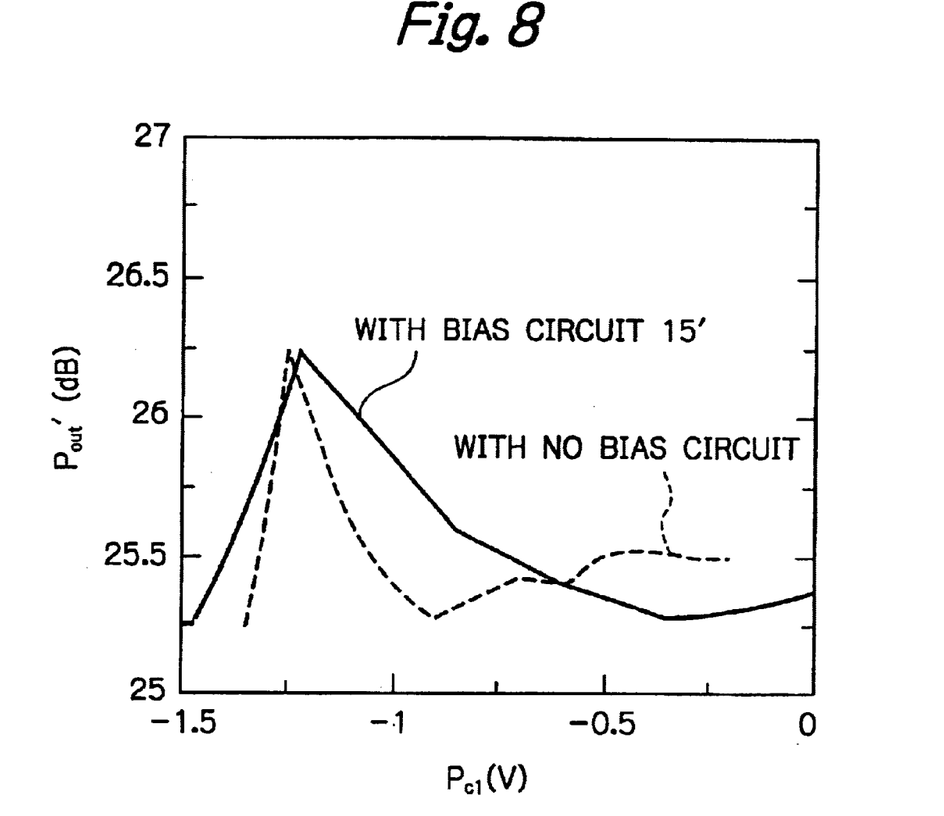
FIG. 8 is a diagram showing the output characteristics of the nonlinear amplifier of FIG. 1 with the predistortion type linearizer of FIG. 4.

In FIG. 8, which is a diagram showing the output characteristics of the nonlinear amplifier of FIG. 1 with the predistortion type linearizer 1 of FIG. 4, a solid line indicates the output power $P_{out}'$ of the nonlinear amplifier 2 with the predistortion type linearizer 2 of FIG. 4 with the bias circuit 15', while a dot line indicates the output power $P_{out}'$ of the nonlinear amplifier 2 with the predistortion type linearizer 2 of FIG. 4 without the bias circuit 15', i.e., with the bias feed resistor 15 of FIG. 2. That is, the dynamic range of the control voltage $V_{c1}$ is clearly increased by the bias circuit 15'.

Figure 9:
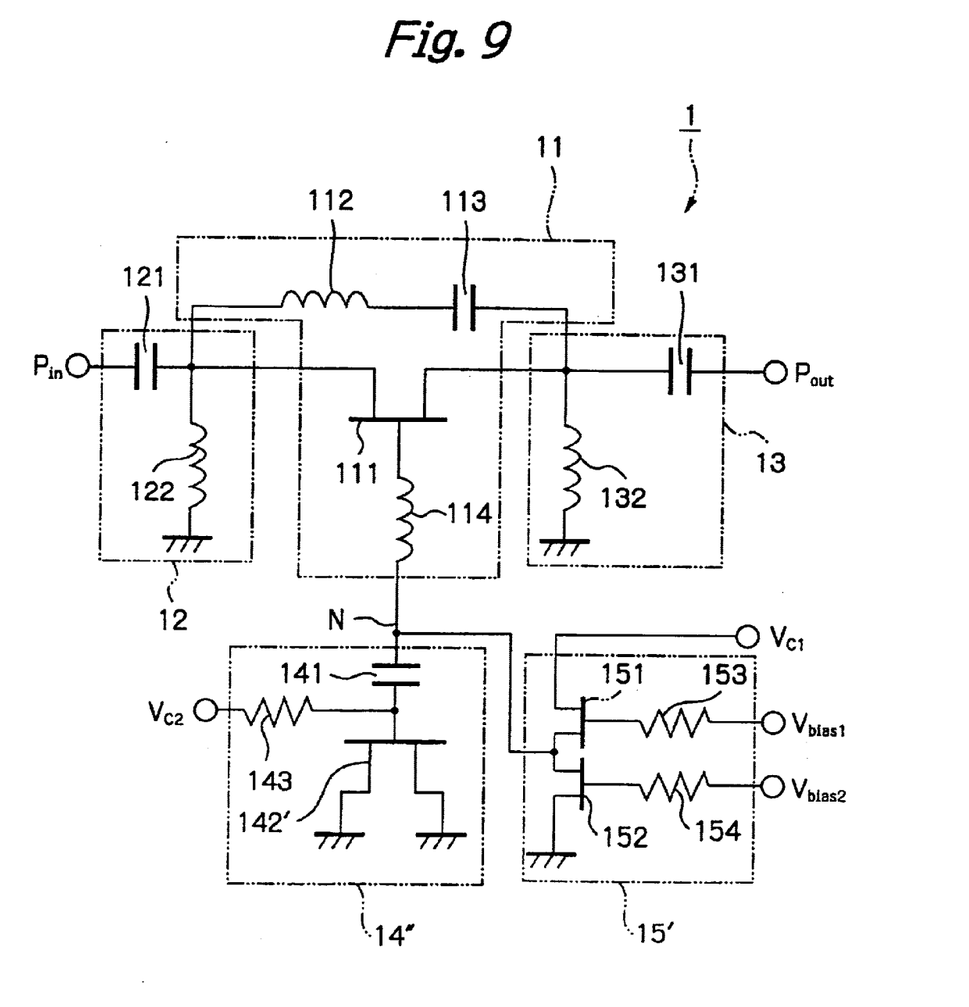
FIG. 9 is a circuit diagram illustrating a second embodiment of the predistortion type linearizer according to the present invention.

In FIG. 9, which illustrates a second embodiment of the predistortion type linearizer according to the present invention, the variable impedance circuit 14' of FIG. 4 is modified into a variable impedance circuit 14". That is, an FET 142' is provided instead of the varactor diode 142 of FIG. 4. The FET 142' has a gate for receiving the control voltage $V_{c2}$, a grounded drain and a grounded source. In this case, the gate-to-drain junction and the gate-to-source junction are biased in the forward and backward directions by the control voltage $V_{c2}$, so that the FET 142' serves as a variable capacitor. Therefore, the predistortion type linearizer 1 of FIG. 9 operates in the same way as the predistortion type linearizer 1 of FIG. 4.

Figure 10:
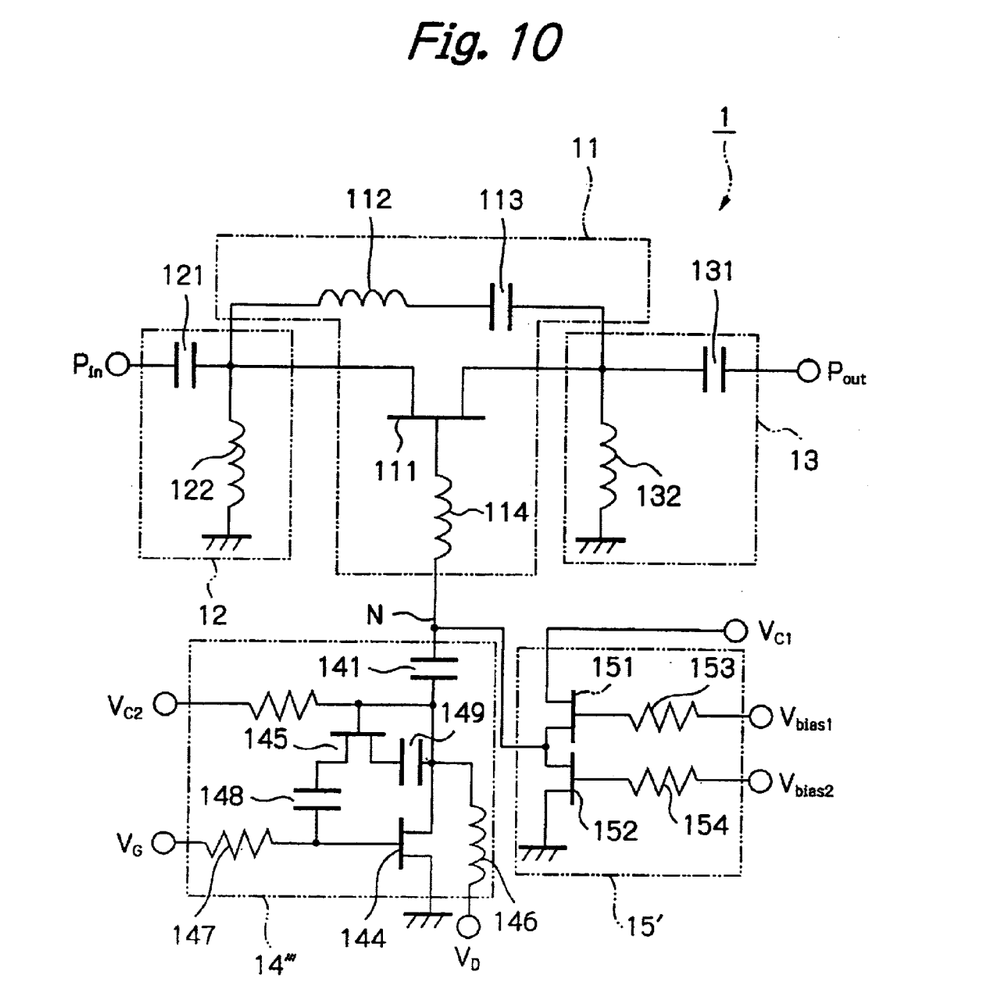
FIG. 10 is a circuit diagram illustrating a third embodiment of the predistortion type linearizer according to the present invention.

In FIG. 10, which illustrates a third embodiment of the predistortion type linearizer according to the present invention, the variable impedance circuit 14' of FIG. 4 is modified into a variable impedance circuit 14'''. That is, the variable impedance circuit 14''' is constructed by FETs 144 and 145, an inductor 146, a resistor 147, and capacitors 148 and 149 in addition to the capacitor 141 and the resistor 142 of FIG. 4.

The FET 145 and the capacitors 148 and 149 serve as a part of a variable inductor which includes the FET 144, the gate of the FET 144 is biased at a definite DC voltage $V_G$ through the resistor 147, while the drain of the FET 144 is biased at a definite DC voltage $V_p$ through the inductor 146 serving as a RF block.

Also, the FET 145 serves as a feedback resistance for controlling the impedance of the FET 144.

When the control voltage $V_{c2}$ is changed, the feedback resistance of the FET 145 is changed so as to change the impedance of the FET 144 followed by the change of the impedance at the gate of the FET 145. This makes the gain deviation of the predistortion type linearizer 1 of FIG. 10 positive and also, makes the phase deviation of the predistortion type linearizer 1 of FIG. 10 negative.

Figure 11A:
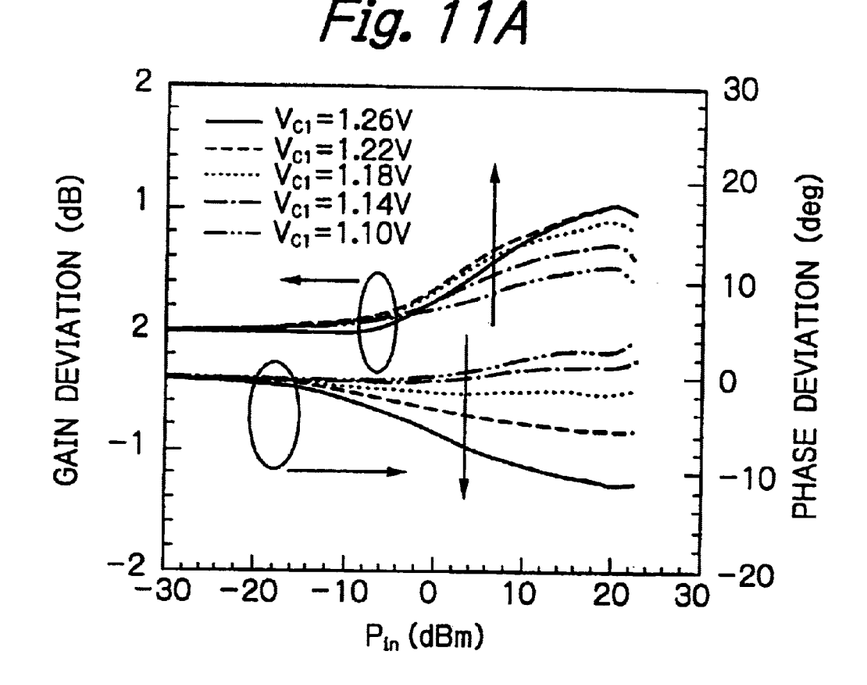
FIGS. 11A and 11B are diagrams showing the gain and phase deviation characteristics of the predistortion type linearizer of FIG. 10.
Figure 11B:
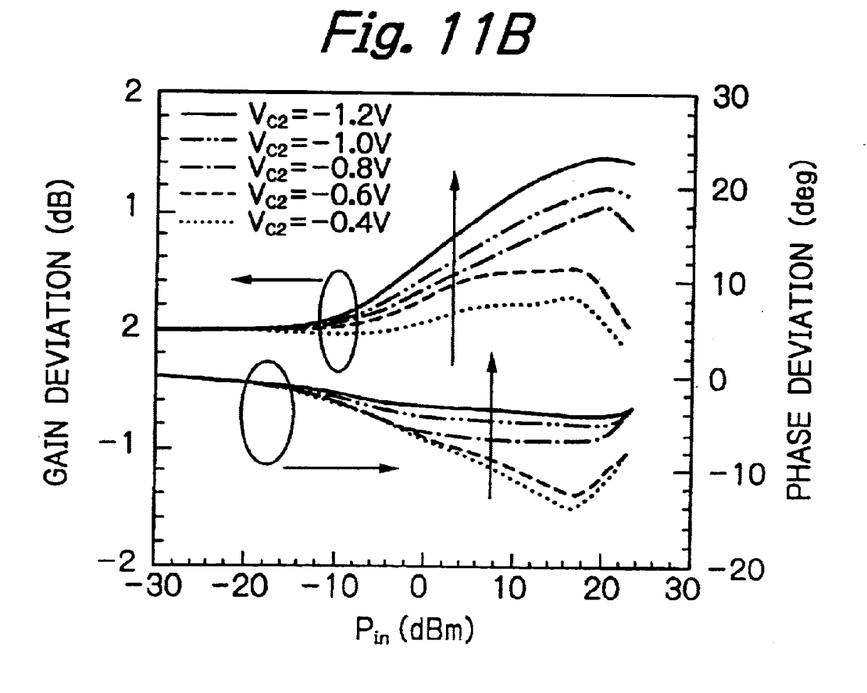

The gain and phase characteristics of the predistortion type linearizer 1 of FIG. 10 at 1.95 GHz are shown in FIGS. 11A and 11B. In FIG. 11A, when the control voltage $V_{c1}$ is changed with the same level of the control voltage $V_{c2}$, the gain and phase deviation characteristics art both changed depending upon the control voltage $V_{c1}$. In this case, when the control voltage $V_{c1}$ is increased, the gain deviation is increased while the phase deviation is decreased. On the other hand, in FIG. 11B, when the value of the control voltage $V_{c2}$ is changed with the same level of the control voltage $V_{c1}$, the gain deviation characteristics are both changed depending the control voltage $V_{c2}$. In this case, when the control voltage $V_{c2}$ is increased, the gain deviation is increased and the phase deviation is also increased. That is, the gain deviation and the phase deviation are changed in opposite ways by the control voltage $V_{c1}$, while the gain deviation and the phase deviation are changed in the same way by the control voltage $V_{c2}$.

Thus, independent control of the gain and phase deviation characteristics of the predistortion type linearizer 1 of FIG. 10 are achieved by changing the value of the control voltage $V_{c1}$ and the value of the control voltage $V_{c2}$. In more detail, first, one of the gain deviation and the phase deviation is adjusted by the control voltage $V_{c1}$, so that the one of the gain deviation and the phase deviation is brought close to a first desired value. In this case, the other of the gain deviation and the phase deviation may be not optimum. Then, the other of the gain deviation and the phase deviation is adjusted by the control voltage $V_{c2}$, so that the other of the gain deviation and the phase deviation is brought close to a second desired value. In this case, the one of the gain deviation and the phase deviation may be also not optimum. Then, the one of the gain deviation and the phase deviation is adjusted by the control voltage $V_{c2}$, so that the one of the gain deviation and the phase deviation is brought close to the first desired value. In this case, the other of the gain deviation and the phase deviation may again not be optimum. The above-mentioned adjustment of the control voltages $V_{c1}$ and $V_{c2}$ is repeated until the gain deviation and the phase deviation are both brought close to the first and second desired values.

As explained hereinabove, according to the present invention, since the gain and phase deviation characteristics of a predistortion type linearizer are independently adjusted by two control voltages, the gain deviation and phase deviation characteristics of a nonlinear amplifier cascade-connected to the predistortion type linearizer can be completely compensated for.

What is claimed is:

1. A predistortion type linearizer comprising:
    a first FET having a gate, a drain and a source;
    an input matching circuit, connected to the drain of said first FET, for receiving an input signal;
    an output matching circuit, connected to the source of said first FET, for outputting an output signal;
    a first inductor having a first terminal connected to the gate of said first FET and a second terminal for receiving a first control voltage; and
    a variable impedance circuit, connected to the second terminal of said first inductor, an impedance of said variable impedance circuit being adjusted by a second control voltage.

2. The predistortion type linearized as set forth in claim 1, further comprising an LC resonant circuit connected between the drain and source of said first FET.

3. The predistortion type linearizer as set forth in claim 1, wherein said input matching circuit comprises:
    a first capacitor, connected to the drain of said first FET, for receiving said input signal; and
    a first grounded inductor connected to the drain of said first FET.

4. The predistortion type linearizer as set forth in claim 1, wherein said output matching circuit comprises:
    a second capacitor, connected to the source of said first FET, for outputting said output signal; and
    a second grounded inductor connected to the source of said first FET.

5. The predistortion type linearizer as set forth in claim 1, wherein said variable impedance circuit comprises:
    a third capacitor connected to the second terminal of said first inductor;
    a varactor diode connected between said third capacitor and ground; and
    a first resistor, connected to a node between said third capacitor and said varactor diode, for receiving said second control voltage.

6. The predistortion type linearizer as set forth in claim 1, wherein said variable impedance circuit comprises:
    a third capacitor connected to the second terminal of said first inductor;
    a second FET having a gate connected to said third capacitor, a grounded drain and a grounded source; and a first resistor, connected to a node between said third capacitor and said second FET, for receiving said second control voltage.

7. The predistortion type linearizer as set forth in claim 1, wherein said variable impedance circuit comprises:
   a third capacitor connected to the second terminal of said first inductor;
   a second FET having a gate, a drain connected to said third capacitor and a grounded source;
   a second inductor, connected to the drain of said second FET, for receiving a first definite voltage;
   a first resistor, connected to the drain of said second FET, for receiving said second control voltage;
   a second resistor, connected to the gate of said second FET, for receiving a second definite voltage;
   a fourth capacitor, a third FET and a fifth capacitor, connected between the gate and drain of said second FET, a gate of said third FET being connected to the drain of said second FET.

8. The predistortion type linearizer as set forth in claim 1, further comprising a bias circuit, connected to the second terminal of said first inductor, for receiving said first control voltage.

9. The predistortion type linearizer as set forth in claim 8, wherein said bias circuit comprises:
   a plurality of fourth FETs in series for receiving said first control voltage, an intermediate node of said fourth FETs being connected to the second terminal of said first inductor; and
   a plurality of resistors, each connected to a gate of one of said fourth FETs, for receiving definite voltages.

10. A predistortion type linearizer comprising:
    a first FET having a gate, a drain and a source;
    an LC resonant circuit connected between the drain and source of said first FET;
    a first capacitor, connected to the drain of said first FET, for receiving an input signal;
    a grounded inductor connected to the drain of said first FET;
    a second capacitor, connected to the source of said first FET, for outputting an output signal;
    a second grounded inductor connected to the source of said first FET;
    a first inductor having a first terminal connected to the gate of said first FET and a second terminal for receiving a first control voltage; and
    a variable impedance circuit,
    said variable impedance circuit comprising:
       a third capacitor connected to the second terminal of said first inductor;
       a varactor diode connected between said third capacitor and ground; and
       a first resistor, connected to a node between said third capacitor and said varactor diode, for receiving a second control voltage.

11. The predistortion type linearizer as set forth in claim 10, further comprising a bias circuit, connected to the second terminal of said first inductor, for receiving said first control voltage.

12. The predistortion type linearizer as set forth in claim 11, wherein said bias circuit comprises:
    a plurality of second FETs in series for receiving said first control voltage, an intermediate node of said second FETs being connected to the second terminal of said first inductor; and
    a plurality of second resistors, each connected to a gate of one of said second FETs, for receiving definite voltages.

13. A predistortion type linearizer comprising:
    a first FET having a gate, a drain and a source;
    an LC resonant circuit connected between the drain and source of said first FET;
    a first capacitor, connected to the drain of said first FET, for receiving an input signal;
    a grounded inductor connected to the drain of said first FET;
    a second capacitor, connected to the source of said first FET, for outputting an output signal;
    a second grounded inductor connected to the source of said first FET;
    a first inductor having a first terminal connected to the gate of said first FET and a second terminal for receiving a first control voltage; and
    a variable impedance circuit,
    said variable impedance circuit comprising:
       a third capacitor connected to the second terminal of said first inductor;
       a second FET having a gate connected to said third capacitor, a grounded drain and a grounded source; and
       a first resistor, connected to a node between said third capacitor and said second FET, for receiving a second control voltage.

14. The predistortion type linearizer as set forth in claim 13, further comprising a bias circuit, connected to the second terminal of said first inductor, for receiving said first control voltage.

15. The predistortion type linearizer as set forth in claim 13, wherein said bias circuit comprises:
    a plurality of third FETs in series for receiving said first control voltage, an intermediate node of said third FETs being connected to the second terminal of said first inductor; and
    a plurality of second resistors, each connected to a gate of one of said third FETs, for receiving definite voltages.

16. A predistortion type linearizer comprising:
    a first FET having a gate, a drain and a source;
    an LC resonant circuit connected between the drain and source of said first FET;
    a first capacitor, connected to the drain of said first FET, for receiving an input signal;
    a grounded inductor connected to the drain of said first FET;
    a second capacitor, connected to the source of said first FET, for outputting an output signal;
    a second grounded inductor connected to the source of said first FET;
    a first inductor having a first terminal connected to the gate of said first FET and a second terminal for receiving a first control voltage; and
    a variable impedance circuit, said variable impedance circuit comprising:
       a third capacitor connected to the second terminal of said first inductor;
       a second FET having a gate, a drain connected to said third capacitor and a grounded source;
       a second inductor, connected to the drain of said second FET, for receiving a first definite voltage;

a first resistor, connected to the drain of said second FET, for receiving a second control voltage;

a second resistor, connected to the gate of said second FET, for receiving a second definite voltage;

a fourth capacitor, a third FET and a fifth capacitor, connected between the gate and drain of said second FET, a gate of said third FET being connected to the drain of said second FET.

17. The predistortion type linearizer as set forth in claim 16 further comprising a bias circuit, connected to the second terminal of said first inductor, for receiving said first control voltage.

18. The predistortion type linearizer as set forth in claim 17, wherein said bias circuit comprises:

a plurality of fourth FETs in series for receiving said first control voltage, an intermediate node of said fourth FETs being connected to the second terminal of said first inductor; and a plurality of fourth resistors, each connected to a gate of one of said fourth FETs, for receiving third definite voltages.

* * * * *